US 7,001,471 B2

(12) United States Patent
Ritzdorf et al.

(10) Patent No.: US 7,001,471 B2
(45) Date of Patent: Feb. 21, 2006

(54) METHOD AND APPARATUS FOR LOW-TEMPERATURE ANNEALING OF METALLIZATION MICROSTRUCTURES IN THE PRODUCTION OF A MICROELECTRONIC DEVICE

(75) Inventors: Thomas L. Ritzdorf, Bigfork, MT (US); E. Henry Stevens, Colorado Springs, CO (US); LinLin Chen, Kalispell, MT (US); Lyndon W. Graham, Kalispell, MT (US); Curt Dundas, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 974 days.

(21) Appl. No.: 09/386,734

(22) Filed: Aug. 31, 1999

(65) Prior Publication Data

US 2002/0000271 A1    Jan. 3, 2002

Related U.S. Application Data

(63) Continuation of application No. PCT/US99/02504, filed on Feb. 4, 1999, which is a continuation-in-part of application No. 09/018,783, filed on Feb. 4, 1998.

(60) Provisional application No. 60/087,432, filed on Jun. 1, 1998.

(51) Int. Cl.
  *C22F 1/08*   (2006.01)
  *C25D 5/50*   (2006.01)
(52) U.S. Cl. .................. 148/518; 148/536; 148/679; 205/157; 205/224; 205/227
(58) Field of Classification Search ................ 148/518, 148/536, 679; 205/157, 224, 227
See application file for complete search history.

(56) References Cited

U.S. PATENT DOCUMENTS 2,443,599 A    6/1948  Chester
3,894,918 A    7/1975  Corby et al.

(Continued)

FOREIGN PATENT DOCUMENTS

EP    0 751 567 A2    1/1997

(Continued)

OTHER PUBLICATIONS

Stoychev. D.S., Tomov, V., Vitanova, I.B., "Recovery And Recrystallization Of Electrodeposited Bright Copper Coatings At Room Temperature. I Microhardness in relation to Coating Structure", *Journal of Applied Electrochemistry*, 15, 879-886. Chapman and Hall Ltd. (1985).

(Continued)

*Primary Examiner*—George Wyszomierski
(74) *Attorney, Agent, or Firm*—Perkins Coie LLP

(57) ABSTRACT

A method for filling recessed microstructures at a surface of a microelectronic workpiece, such as a semiconductor wafer, with metallization is set forth. In accordance with the method, a metal layer is deposited into the microstructures with a process, such as an electroplating process, that generates metal grains that are sufficiently small so as to substantially fill the recessed microstructures. The deposited metal is subsequently subjected to an annealing process at a temperature below about 100 degrees Celsius, and may even take place at ambient room temperature to allow grain growth which provides optimal electrical properties. Various novel apparatus for executing unique annealing processes are also set forth.

102 Claims, 7 Drawing Sheets

U.S. PATENT DOCUMENTS

| | | | |
|---|---|---|---|
| 4,250,004 A | 2/1981 | Miles et al. | |
| 4,539,222 A | 9/1985 | Anderson, Jr. et al. | |
| 4,687,552 A | 8/1987 | Early et al. | |
| 4,781,801 A | 11/1988 | Frisby | |
| 4,891,069 A | 1/1990 | Holtzman et al. | |
| 5,084,412 A | 1/1992 | Nakasaki | |
| 5,091,339 A | 2/1992 | Carey | |
| 5,145,571 A | 9/1992 | Lane et al. | |
| 5,160,600 A * | 11/1992 | Patel et al. | 205/167 |
| 5,164,332 A | 11/1992 | Kumar | |
| 5,256,274 A | 10/1993 | Poris | |
| 5,256,565 A | 10/1993 | Bernhardt et al. | |
| 5,277,985 A | 1/1994 | Li et al. | |
| 5,314,756 A | 5/1994 | Tagaya | |
| 5,397,741 A | 3/1995 | O'Connor et al. | |
| 5,431,803 A | 7/1995 | DiFranco et al. | |
| 5,441,618 A | 8/1995 | Matsuda et al. | |
| 5,447,599 A | 9/1995 | Li et al. | |
| 5,600,532 A | 2/1997 | Michiya et al. | |
| 5,605,615 A | 2/1997 | Goolsby et al. | |
| 5,612,254 A | 3/1997 | Mu et al. | |
| 5,627,102 A | 5/1997 | Shinriki et al. | |
| 5,651,823 A | 7/1997 | Parodi et al. | |
| 5,674,787 A | 10/1997 | Zhao et al. | |
| 5,677,244 A | 10/1997 | Venkatraman | |
| 5,693,563 A | 12/1997 | Teong | |
| 5,707,466 A | 1/1998 | Atwater et al. | |
| 5,747,355 A | 5/1998 | Konuma et al. | |
| 5,763,953 A | 6/1998 | Iljima et al. | |
| 5,779,799 A | 7/1998 | Davis | |
| 5,801,444 A * | 9/1998 | Aboelfotoh et al. | 257/762 |
| 5,814,557 A | 9/1998 | Venkatraman et al. | |
| 5,863,666 A | 1/1999 | Merchant et al. | |
| 5,873,992 A | 2/1999 | Glezen et al. | |
| 5,893,752 A | 4/1999 | Zhang et al. | |
| 5,937,142 A | 8/1999 | Moslehi et al. | |
| 5,939,788 A | 8/1999 | McTeer | |
| 5,969,422 A | 10/1999 | Ting et al. | |
| 5,972,192 A | 10/1999 | Dubin et al. | |
| 5,989,623 A | 11/1999 | Chen et al. | |
| 6,001,730 A | 12/1999 | Farkas et al. | |
| 6,015,749 A | 1/2000 | Liu et al. | |
| 6,037,257 A | 3/2000 | Chiang et al. | |
| 6,043,153 A | 3/2000 | Nogami et al. | |
| 6,066,892 A | 5/2000 | Ding et al. | |
| 6,099,712 A | 8/2000 | Ritzdorf et al. | |
| 6,100,195 A | 8/2000 | Chan et al. | |
| 6,121,141 A | 9/2000 | Woo et al. | |
| 6,123,825 A | 9/2000 | Uzoh et al. | |
| 6,126,761 A * | 10/2000 | DeHaven et al. | 148/679 |
| 6,126,989 A | 10/2000 | Robinson et al. | |
| 6,136,163 A | 10/2000 | Cheung et al. | |
| 6,139,697 A | 10/2000 | Chen et al. | |
| 6,184,121 B1 | 2/2001 | Buchwalter et al. | |
| 6,184,137 B1 | 2/2001 | Ding et al. | |
| 6,228,768 B1 | 5/2001 | Woo et al. | |
| 6,254,758 B1 * | 7/2001 | Koyama | 205/224 |
| 6,278,089 B1 | 8/2001 | Young et al. | |
| 6,280,183 B1 | 8/2001 | Mayur et al. | |
| 6,297,154 B1 | 10/2001 | Gross et al. | |
| 2003/0162392 A1 * | 8/2003 | Wang et al. | 438/687 |

FOREIGN PATENT DOCUMENTS

| | | |
|---|---|---|
| EP | 0 881 673 A2 | 12/1998 |
| EP | 0 982 771 A1 | 3/2000 |
| WO | WO 98/27585 | 6/1998 |

OTHER PUBLICATIONS

Harper, J.M.E., Rodbell, K.P., "Microstructure control in semiconductor metallization", *J. Vac. Sci. Technol.* E 15(4), pp. 763-799, Jul/Aug 1997.

Gangulee, A., "The Structure of Electroplated and Vapor-Deposited Copper Films", *J. Appl. Phys.*, vol. 43, No. 3, pp. 867-873, Mar. 1972.

Gangulee, A., "Structure of Electroplated and Vapor-Deposited Copper Films III. Recrystallization and Grain Growth", *J. Appl. Phys.*, vol. 45, No. 9, pp. 3749-3756, Sep. 1974.

Gross, M.E. et al, "Microstructure and Texture of Electroplated Copper in Damascene Structures", *Material Research Society Proceedings*, vol. 514, 1998.

Edelstein, D. et al, "Full Copper Wiring in a Sub-0.25 $\mu$m CMOS ULSI Technology", IEEE, pp. 773-776, 1997.

Ryan, J.G. et al, "Technology Challenges for Advanced Interconnects", Date Unknown.

Lowenheim, Frederick, "Electroplating", pp. 416-425, Jan. 1979.

Patent Abstracts of Japan 04-120290, Apr. 21, 1992.

Nguyen et al, "Interconnect and Contact Metallization", Eds. H.S. Rathore, G.S. Mathan, C. Plougonven and C.C. Schuckert, PV 97-31, The Electrochemical Society, Inc., Pennington, NJ.

Foulke, D.G., in *"Gold Plating Technology"*, Reid, F.H. and Goldie, W., p. 67, Electrochemical Publication Limited, British Isles (1996).

Tomov, V., Stoychev. D.S., Vitanova, I.B., "Recovery And Recrystallization Of Electrodeposited Bright Copper Coatings At Room Temperature. II. X-Ray Investigation Of Primary Recrystallization,", *Journal of Applied Electrochemistry*, 15, 887-894. Chapman and Hall Ltd. (1985).

Ritzdorf, T., Graham, L., Jin, S., Mu, C. and Fraser, D., "Self-Annealing of Electrochemically Deposited Copper Films in Advanced Interconnect Applications," Proceedings of the IEEE 1998 International Interconnect Technology Conference, San Francisco, CA (Jun. 1-3, 1998).

Dubin, V.M., Shacham-Diamand, Y., Zhao, B., Vasudev, P.K. and Ting, C.H., "Sub-Half Micron Electroless Cu Metallization," Materials Research Society Symposium Proceedings, vol. 427, San Francisco (1996).

Cook, M. and Richards, T., "The Self-Annealing of Copper," *J. Inst. Metals*, vol. LXX, pp. 159-173 (1943).

Ahn, E.C., et al "Adhesion Reliability of Cu-Cr Alloy Films To Plyimide," Met. Res. Soc. Symp. Proc. vol. 427, 1996 Materials Research Society, pp. 141-145.

Alers, G.B., "Trade-off between reliability and post-CMP defects during recrystalliztion anneal for copper damascene interconnects," IEEE International Reliability Physics Symposium, Orlando, Florida 2001, pp. 350-354.

Gladkikh, A. et al, "Activation Energy of Electromigration in Copper Thin Film Conductor Lines," Met. Res. Soc. Symp. Proc. 1996 Materials Research Society, pp. 121-133.

Kononenko, O.V. et al. "Electromigration in Submicron Wide Copper Lines," Met. Res. Soc. Symp. Proc. 1996 Materials Research Society, pp. 127-133.

Mel, Yu-Jane et al. "Thermal Stability and Interaction Between Siof and Cu Film," Met. Res. Soc. Symp. Proc. vol. 427, 1996 Materials Research Society, pp. 433-439.

Russell, S.W. et al. The Effect of Copper on the Titanium-Silicon Dioxide Reaction and the Implications for Self-Encapsulating, Self-Adhering Metallization Lines, Materials Research Society Symposium vol. 260 (May 1992) pp 763-767.

USPTO Office Action communication mailed Jun. 15, 2005; Ritzdorf et al., U.S. Appl. No. 09/885,451, filed Jun. 20, 2001;Attorney Ref No. 29195-8170US2 (16 pgs).

* cited by examiner

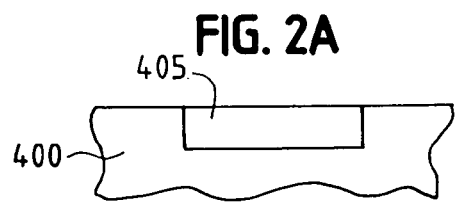
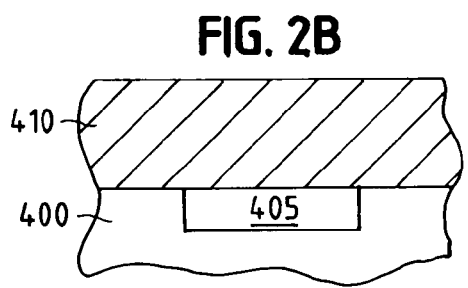
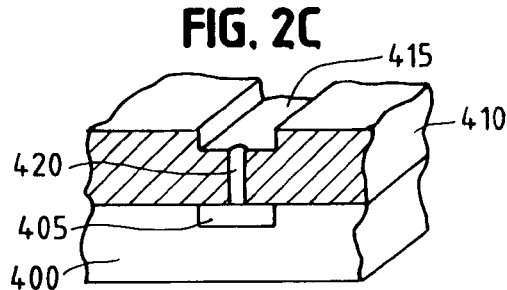
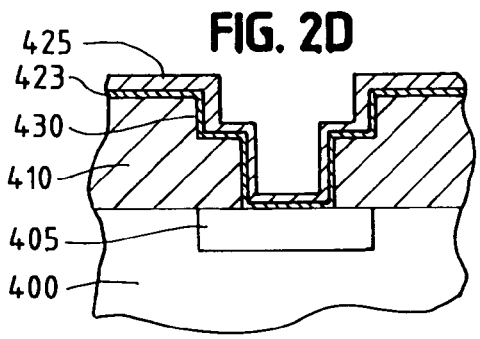
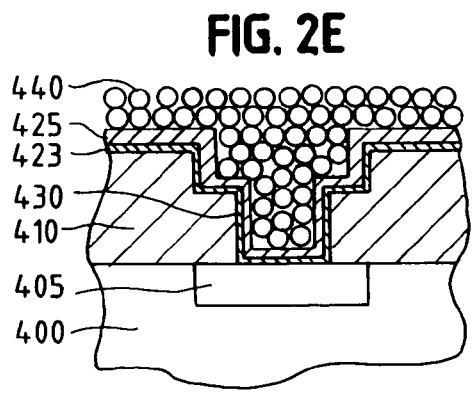
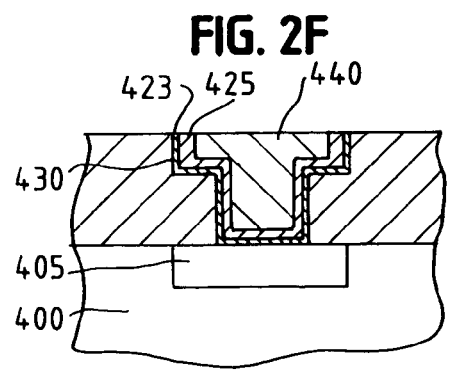
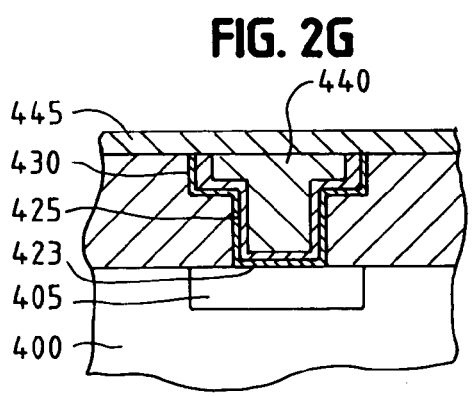

METHOD AND APPARATUS FOR LOW-TEMPERATURE ANNEALING OF METALLIZATION MICROSTRUCTURES IN THE PRODUCTION OF A MICROELECTRONIC DEVICE

CROSS-REFERENCE TO RELATED APPLICATIONS

This is a continuation application of International PCT Patent Application No. PCT/US99/02504, designating the U.S., filed Feb. 4, 1999, entitled METHOD AND APPARATUS FOR LOW TEMPERATURE ANNEALING OF METALLIZATION MICRO-STRUCTURES IN THE PRODUCTION OF A MICROELECTRONIC DEVICE, which is a continuation-in-part of U.S. patent application Ser. No. 09/018,783, filed Feb. 4, 1998, and U.S. patent application Ser. No. 60/087,432 filed Jun. 1, 1998.

STATEMENT REGARDING FEDERALLY SPONSORED RESEARCH OR DEVELOPMENT

Not Applicable

BACKGROUND OF THE INVENTION

In the production of semiconductor integrated circuits and other microelectronic articles from microelectronic workpieces, such as semiconductor wafers, it is often necessary to provide multiple metal layers on a substrate to serve as interconnect metallization which electrically connects the various devices on the integrated circuit to one another. Traditionally, aluminum has been used for such interconnects, however, it is now recognized that copper metallization may be preferable.

Modern semiconductor manufacturing processes, especially those used for advanced logic devices, make use of multiple layers of metal interconnects. As the length of metal interconnects increases and the cross-sectional area and spacing between them decreases, the RC delay caused by the interconnect wiring also increases. With the drive toward decreasing interconnect size and the increasing demands placed on the interconnects, the current aluminum interconnect technology becomes deficient. Copper interconnects can help alleviate many of the problems experienced in connection with the current aluminum technology.

In view of the limitations of aluminum interconnect technology, the industry has sought to use copper as the interconnect metallization by using a damascene and/or patterned plating electroplating process where holes, more commonly called vias, trenches and other recesses are used to produce the desired copper patterns. In the damascene process, the wafer is first provided with a metallic seed layer and barrier/adhesion layer that are disposed over a dielectric layer into which trenches are formed. The seed layer is used to conduct electrical current during a subsequent metal electroplating step. Preferably, the seed layer is a very thin layer of metal that can be applied using one of several processes. For example, the seed layer of metal can be laid down using physical vapor deposition or chemical vapor deposition processes to produce a layer on the order of 1000 angstroms thick. The seed layer can also be formed of copper, gold, nickel, palladium, and most or all other metals. The seed layer is formed over a surface that is convoluted by the presence of the trenches, or other device features, which are recessed into the dielectric substrate.

In single damascene processes using electroplating, a process employing two electroplating operations is generally employed. First, a copper layer is electroplated onto the seed layer in the form of a blanket layer. The blanket layer is plated to an extent which forms an overlying layer, with the goal of completely providing a copper layer that fills the trenches that are used to form the horizontal interconnect wiring in the dielectric substrate. The first blanket layer is then subject, for example, to a chemical mechanical polish step in which the portions of the layer extending above the trenches are removed, leaving only the trenches filled with copper. A further dielectric layer is then provided to cover the wafer surface and recessed vias are formed in the further dielectric layer. The recessed vias are disposed to overlie certain of the filled trenches. A further seed layer is applied and a further electroplated copper blanket layer are provided that extend over the surface of the further dielectric layer and fills the vias. Again, copper extending above the level of the vias is removed using, for example, chemical mechanical polishing techniques. The vias thus provide a vertical connection between the original horizontal interconnect layer and a subsequently applied horizontal interconnect layer. Electrochemical deposition of copper films has thus become an important process step in the manufacturing of high-performance microelectronic products.

Alternatively, the trenches and vias may be etched in the dielectric at the same time in what is commonly called a "dual damascene" process. These features are then processed, as above, with barrier layer, seed layer and fill/blanket layer that fill the trenches and vias disposed at the bottoms of the trenches at the same time. The excess material is then polished, as above, to produce inlaid conductors.

The electrical properties of the copper metallization are important to the performance of the associated microelectronic device. Such devices may fail if the copper metallization exhibits excessive electromigration that ultimately results in an open circuit condition in one or more of the metallization structures. One factor that has a very large influence on the electromigration resistance of sub-micron metal lines is the grain size of the deposited metal. This is because grain boundary migration occurs with a much lower activation energy than transgranular migration.

To achieve the desired electrical characteristics for the copper metallization, the grain structure of each deposited blanket layer is altered through an annealing process. This annealing process is traditionally thought to require the performance of a separate processing step at which the semiconductor wafer is subject to an elevated temperature of about 400 degrees Celsius.

The present inventors have recognized substantial improvements over the foregoing processes employing the elevated temperature annealing. To this end, the present inventors have disclosed herein a process for filling vias, trenches, and the like using an electrochemical metal deposition process that does not require a subsequent elevated temperature annealing step or, in the alternative, that uses a subsequent elevated temperature annealing process that takes place at temperatures that are traditionally used in the copper metallization process and are compatible with low temperature semiconductor processing. Additionally, the present inventors have set forth various apparatus for implementing such an annealing process in a controlled manner.

BRIEF SUMMARY OF THE INVENTION

A method for filling recessed microstructures at a surface of a semiconductor wafer with metallization is set forth. In accordance with the method, a layer is deposited into the microstructures with a process, such as an electroplating process, that generates grains that are sufficiently small so as to substantially fill the recessed microstructures. The deposited metal is subsequently subjected to an annealing process at a temperature below about 100 degrees Celsius, and may even take place at ambient room temperature.

One embodiment of the method comprises providing a semiconductor wafer with a feature that is to be connected with copper metallization. At least one dielectric layer is applied over a surface of the semiconductor wafer including the feature. Recessed microstructures are then provided in the at least one dielectric layer. A surface of the wafer, including the recessed microstructures, is provided with barrier/adhesion layer and a seed layer for subsequent electrochemical copper deposition. Copper metallization is electrochemically deposited on the surface of the wafer to substantially fill the recessed microstructures. The present inventor has found that such an electrochemically deposited layer may be annealed at temperatures that are substantially lower than the temperatures typically thought necessary for such annealing. Various methods are set forth that take advantage of this finding.

In a further embodiment of the disclosed method, the electrochemically deposited copper layer is allowed to self-anneal at ambient room temperature for a predetermined period of time before removing copper metallization from the surface of the wafer that extends beyond the recessed features.

In accordance with a still further embodiment of the disclosed method, subsequent wafer processing, including removal of selected areas of the copper metallization, takes place without an intermediate elevated temperature annealing step and may, for example, take place before self-annealing is allowed to occur.

In accordance with a still further embodiment of the method, the electrochemically deposited copper is subject to an elevated temperature annealing process. However, that annealing process takes place at a temperature below about 100 degrees Celsius or at a temperature below which an applied low-K dielectric layer suffers degradation in its mechanical and electrical properties.

Various novel apparatus for executing unique annealing processes are also set forth. One such apparatus for use in applying metallization in recessed micro-structures of a microelectronic workpiece comprises at least one deposition station for depositing a conductive material, such as electrolytically deposited copper, into at least the recessed micro-structures of the microelectronic workpiece. The apparatus also includes at least one annealing station for subjecting the microelectronic workpiece to an annealing temperature that is at or below about 250 degrees Celsius and/or for subjecting the workpiece to a controlled temperature gradient. The temperature gradient may be such that the temperature decreases in a direction that is opposite to the direction of formation of the metal material as it is deposited at the at least one deposition station.

BRIEF DESCRIPTION OF THE SEVERAL VIEWS OF THE DRAWINGS

FIGS. 2A–2G illustrate the various steps used in one embodiment of the disclosed method.

DETAILED DESCRIPTION OF THE INVENTION

Figure 1:
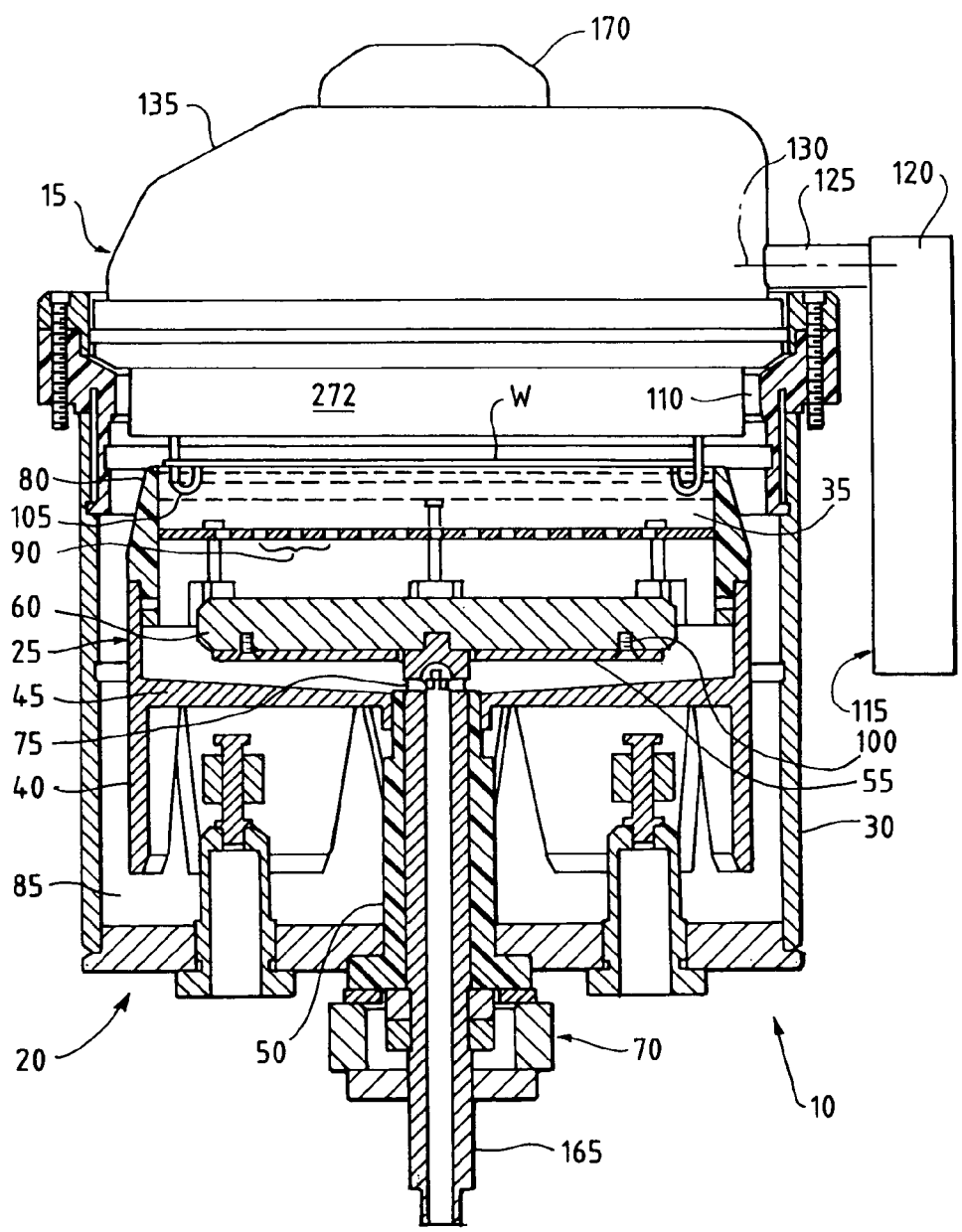
FIG. 1 illustrates one embodiment of a plating apparatus that may be used to apply an electrochemically deposited copper metallization layer to the surface of a semiconductor wafer in accordance with the disclosed methods. disclosed method.

FIG. 1 shows various components of a processing station 10 suitable for electroplating a metal, such as copper, onto a semiconductor wafer in accordance with the disclosed method. The two principal parts of processing station 10 are a processing head, shown generally at 15, and an electroplating bowl assembly 20. It will be recognized, however, that a wide variety of processing station configurations may be used to implement the disclosed method and that the specific construction of the station 10 is merely exemplary. To this end, such a processing station may merely comprise an anode, one or more wafer contacts to render the wafer a cathode, a plating chamber having a plating bath that contacts both the wafer and the anode, and a source of plating power. Various configurations of these elements may be employed.

As shown in FIG. 1, the electroplating bowl assembly 20 includes a cup assembly 25 that is disposed within a reservoir container 30. Cup assembly 25 includes a fluid cup portion 35 holding the chemistry for the electroplating process. The cup assembly of the illustrated embodiment also has a depending skirt 40 which extends below the cup bottom 45 and may have flutes open therethrough for fluid communication and release of any gas that might collect as the chamber of the reservoir assembly below fills with liquid. The cup is preferably made from polypropylene or other suitable material.

A lower opening in the bottom wall of the cup assembly 25 is connected to a polypropylene riser tube 50 which, for example, is adjustable in height relative thereto by a threaded connection. A first end of the riser tube 50 is secured to the rear portion of an anode shield 55 that supports anode 60. A fluid inlet line 165 is disposed within the riser tube 50. Both the riser tube 50 and the fluid inlet line are secured with the processing bowl assembly 20 by a fitting 70. The fitting 70 can accommodate height adjustment of both the riser tube and line 65. As such, the connection between the fitting 70 and the riser tube 50 facilitates vertical adjustment of the anode position. The inlet line 65 is preferably made from a conductive material, such as titanium, and is used to conduct electrical current to the anode 60, as well as supply fluid to the cup.

Process fluid is provided to the cup through fluid inlet line 65 and proceeds therefrom through fluid inlet openings 75. Plating fluid then fills the chamber 35 through openings 75 as supplied by a plating fluid pump (not shown) or other suitable supply.

The upper edge of the cup sidewall 80 forms a weir that limits the level of electroplating solution within the cup. This level is chosen so that only the bottom surface of wafer W is contacted by the electroplating solution. Excess solution pours over this top edge surface into an overflow chamber 85.

The outflow liquid from chamber 85 is preferably returned to a suitable reservoir. The liquid can then be treated with additional plating chemicals or other constituents of the plating or other process liquid and used again.

In preferred use of the apparatus for electroplating, the anode 60 is a consumable anode used in connection with the plating of copper or other metals onto semiconductor materials. The specific anode may alternatively be an inert anode, the anode used in station 10 varying depending upon the specifics of the plating liquid and process being used.

The embodiment of the station shown in FIG. 1 also employs a diffuser plate 90 which is disposed above the anode 60 for providing a more even distribution of the flow of the fluid plating bath across the surface of wafer W. Fluid passages are provided over all or a portion of the diffuser plate 90 to allow fluid communication therethrough. The height of the diffuser plate within the cup assembly may be adjustable using height adjustment mechanisms 95.

The anode shield 55 is secured to the underside of the consumable anode 60 using anode shield fasteners 100 to prevent direct impingement by the plating solution as the solution passes into the processing chamber 35. The anode shield 55 and anode shield fasteners 100 are preferably made from a dielectric material, such as polyvinylidene fluoride or polypropylene. The anode shield serves to electrically isolate and physically protect the backside of the anode.

The processing head 15 holds a wafer W within the processing chamber 35. In the disclosed embodiment of station 10, the head 15 is constructed to rotate the wafer W within chamber 35. To this end, the processing head 15 includes a rotor assembly 150 having a plurality of wafer-engaging contact fingers 105 that hold the wafer against features of the rotor. Fingers 105 are preferably adapted to conduct current between the wafer and a plating electrical power supply and may be constructed in accordance with various configurations.

The processing head 15 is supported by an head operator 115. Head operator 115 includes an upper portion 120 that is adjustable in elevation to allow height adjustment of the processing head. Head operator 115 also has a head connection shaft 125 that is operable to pivot about a horizontal pivot axis 130. Pivotal action of the processing head using operator 115 allows the processing head to be placed in an open or face-up position (not shown) for loading and unloading wafer W. FIG. 1 illustrates the processing head pivoted into a face-down position in preparation for processing. It will be recognized that such flipping of the wafer is not necessary to the performance of the disclosed methods.

FIGS. 2A–2G illustrate one method of filling a trench and via formed on the surface of a semiconductor wafer wherein the electrochemically deposited copper layer may be applied using the apparatus described in connection with FIG. 1. FIG. 2A illustrates a base 400 having an area 405 that is to be connected by copper metallization. In FIG. 2B a layer 410 of dielectric material, such as silicon dioxide or a low-K dielectric material, is deposited over the base 400 including over area 405. Through a photoresist process and reactive ion etch or the like, selective portions of layer 410 are removed to form, for example, a trench 415 and via 420 into which copper metallization is to be deposited. The end structure is shown in the perspective view of FIG. 2C wherein the via 420 overlies connection area 405 and trench 415 overlies via 420. Connection area 405 may be, for example, a metallization feature above the substrate.

As shown in FIG. 2D, a barrier layer 423 and seed layer 425 may be disposed on the surface of dielectric layer 410. The barrier layer may be, for example, tantalum or titanium nitride. The barrier layer 423 is typically used when the structure 405 is susceptible to contamination from copper or the seed layer metal, and/or when the seed layer metal or copper may readily migrate through the dielectric layer 410 and contaminate other portions of the microelectronic circuit. As such, barrier layer 423 should be sufficiently thick along the contour of the trenches and vias to act as a diffusion barrier. Layer 423 may also function as an adhesion layer to facilitate binding between the seed layer 425 and the dielectric 410. If, however, the structure 405 is not susceptible to such contamination, there is sufficient adhesion, and the dielectric layer 410 itself acts as a barrier layer, then a separate barrier layer 423 may not be necessary. The seed layer 425 may, for example, be a copper layer or other conductive metal layer and is preferably at least 200 Angstroms thick at its thinnest point. Sidewalls 430 of the trench 415 and via 420 as well as the bottom of via 420 should be covered by the seed layer 425 and barrier layer 423 to facilitate a subsequent electrochemical copper deposition step. The seed layer 425 may be deposited through, for example, a CVD or PVD process.

The semiconductor wafer with the seed layer 425 is subject to a subsequent electrochemical copper deposition process. The electrochemical copper deposition process is executed so as to form numerous nucleation sites for the copper deposition to thereby form grain sizes that are substantially smaller than the characteristic dimensions of the via 420 and trench 415. An exemplary structure having such characteristics is illustrated in FIG. 2E wherein layer 440 is a layer of copper metallization that has been deposited using an electrochemical deposition process.

As shown in FIG. 2E, the copper metallization 440 formed in the electrochemical deposition process is deposited over the seed layer 425 and extends a distance above the surface of dielectric layer 410. Since the only features that are to contain the metallization are the via 420 and trench 415, excess copper above the dielectric layer 410 must be removed. Removal of the excess copper above the upper surface of the dielectric layer 410 may be executed using a chemical mechanical polish technique. An exemplary structure in which such removal has taken place is illustrated in FIG. 2F. After such removal, a capping barrier layer 445 may be disposed, for example, over the entire surface of the wafer, or the processes set forth in FIGS. 2A–2F may be repeated without a capping barrier layer 445 whereby the trench 415, now filled with copper metallization, corresponds to the structure 405 that further copper metallization is to contact.

A comparison between FIGS. 2E and 2F reveals that an increase in the grain size of the copper layer 440 has taken place. Traditionally, the change in the grain size has been forced through an annealing process. In such an annealing process, the wafer is subject to an elevated temperature that is substantially above the ambient temperature conditions normally found in a clean room. For example, such annealing usually takes place in a furnace having a temperature generally around or slightly below 400 degrees Celsius, or about half of the melting temperature of the electrodeposited copper. Annealing steps are normally performed at a temperature of at least 25 percent of the melting point temperature of the material as measured on an absolute temperature scale. As such, a separate annealing step is performed on the wafer using a separate piece of capital equipment. Such an annealing step is usually performed for each layer of metallization that is deposited on the wafer. These additional steps increase the cost of manufacturing devices from the wafer and, further, provide yet another step in which the wafer may be mishandled, contaminated or otherwise damaged.

Absent such an annealing step, the traditional view is that the substantial number of grains per given volume in such sub-micron structures significantly decreases the electromigration resistance of the metal lines that are produced and gives the material a higher resistivity. This is because grain boundary migration occurs with a much lower activation energy than trans-granular migration. As such, conventional wisdom dictates that a separate annealing step is required.

The present inventor has found that such a separate annealing step in which the electrochemically deposited copper is subject to a subsequent high temperature annealing process (e.g., at about 400 degrees Celsius) is not, in fact, necessary. Rather, electrochemically deposited copper metallization having grain sizes substantially smaller than the sub-micron structures that they fill may be subject to an annealing process in which the annealing of the copper metallization takes place at, for example, room temperature or at temperatures substantially below 400 degrees Celsius where the annealing process is more easily controlled and throughput is increased.

In accordance with one embodiment of the disclosed method, the electrochemical deposition of the copper layer 440 takes place in the apparatus set forth in FIG. 1. The processing chamber 110 is configured so that the top of the diffuser 90 is approximately between 0.5 cm–5 cm (preferably 2.0 cm) from the top of the cup 25. The distance between the top of the diffuser 90 and the top of the anode 60 is between 0.5 cm–10 cm (preferably 1.6 cm) but always greater than the diffuser to cup distance.

The electrochemical plating solution may be Enthone-OMI Cu Bath M Make-up Solution having 67 g/l of $CuSO_4$, 170 g/l of $H_2SO_4$, and 70 ppm of HCl. The additive solutions utilized may be Enthone-OMI Cu Bath M-D (6.4 ml/l—make-up) and Enthone-OMI Cu Bath M LO 70/30 Special (1.6 ml/l—make-up). The flow rate through the cup 25 of this solution may be approximately 1.0–10 GPM (preferably 5.5 GPM) and the plating temperature may be between about 10–40 degrees Celsius (preferably 25 degrees Celsius). The plating bath could alternatively contain any of a number of additives from manufacturers such as Shipley (Electroposit 1100), Lea Ronal (Copper Gleam PPR), or polyethylene glycol (PEG). An alkaline plating bath suitable for electroplating microelectronic components is set forth in co-pending provisional patent application U.S. Ser. No. 60/085,675, filed 15 May 1998 and entitled "PROCESS AND PLATING SOLUTION FOR ELECTROPLATING A COPPER METALLIZATION LAYER ONTO A WORKPIECE" which is hereby incorporated by reference.

The electrochemical process of the disclosed embodiment may be used to electroplate a copper metallization layer onto the wafer at a thickness sufficient to at least fill the trenches and/or vias. Generally stated, the embodiment disclosed herein may be divided into five sub-processes. A dwell (pre-plate) sub-process takes place when the wafer is first introduced to the electroplating bath. At that time, no plating current is provided. Rather, the surface of the wafer that is to be plated is exposed to the plating bath for a predetermined period of time without plating power, such as for five seconds.

After the dwell cycle, a low current initiation sub-process may ensue. During the low current initiation sub-process, a low plating current is provided between the anode and the wafer. In accordance with the disclosed embodiment, a direct current with a current density of approximately 3.2 $mA/cm^2$ is utilized. The low current process may proceed, for example, for a predetermined period of time such as 30 seconds.

After the low current initiation sub-process is completed, a high current plating sub-process is initiated. It is during this sub-process that a majority of the copper is plated onto the wafer. During this step, a high plating current is provided for the electroplating operations. The plating waveform may be a constant voltage or current, a forward-only pulsed voltage or current, or a forward and reverse voltage or current. In accordance with the disclosed embodiment, and average cathode current density of approximately 20 $mA/cm^2$ is used with a current waveform that is direct current, forward pulsed, or reverse pulsed. Preferably, a direct current or forward only pulsed current is utilized with a frequency between 1 and 1000 Hz. More preferably, the frequency is between 5 and 20 Hz, with a duty cycle between 50 percent and 95 percent. More preferably, the duty cycle is between 65 percent and 85 percent. The time duration of the high current plating sub-process is dependent on the nominal thickness of the copper metallization layer that is to be applied to the wafer. For a copper metallization layer having a nominal thickness of 1.5 microns, the high current sub-process proceeds for approximately three minutes and 40 seconds. During both the low current initiation and high current plating sub-processes, the wafer is preferably spun on the rotor at a rate of between about 1–100 rpm (preferably 20 rpm).

Once the desired amount of copper has been plated onto the wafer, the wafer is lifted from contact with the plating solution. This process takes approximately two seconds, after which the wafer is spun on the rotor to remove the plating solution. For example, the wafer may be spun at 200–2000 rpm (preferably 500 rpm) for a time period of five seconds to remove the majority of the electroplating solution from the surface of the wafer. Subsequent rinsing and drying steps may be executed on the wafer in, for example, other processing chambers dedicated to such functions.

The foregoing process generates nucleation sites, grain growth mechanisms, and copper grain sizes that are sufficiently small so as to fill trenches and vias with widths as low or less than 0.3 micron and aspect ratios greater than 4-to-1. Initial grain size may be varied depending upon the plating waveform used and/or the additives used in the plating solution. Despite the small copper grain size that results from these processes, the resulting copper metallization layer may be annealed at substantially lower temperatures than traditionally suggested to form substantially larger copper grains thereby providing the copper with enhanced electrical characteristics when compared to copper deposition processes that do not promote self-annealing.

Figure 3:
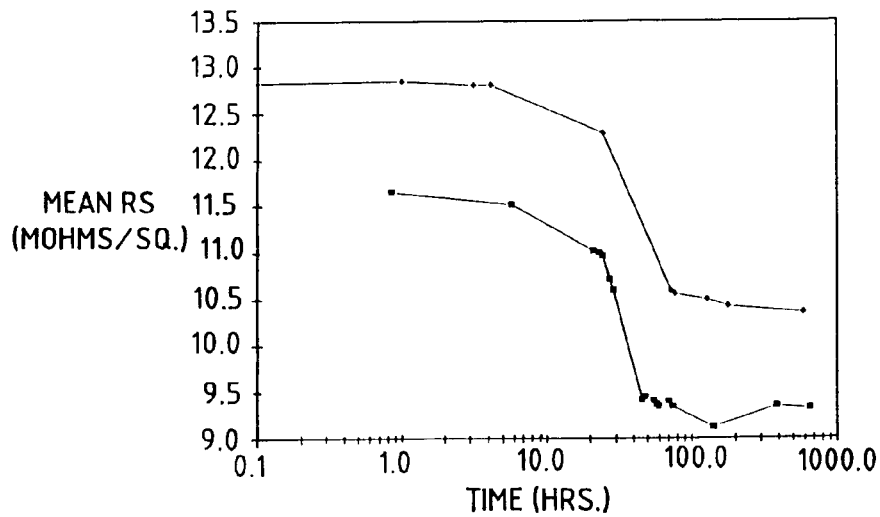
FIG. 3 is a graph showing the sheet resistance of an electrochemically deposited layer that has been deposited in accordance with the disclosed method as a function of time.
Figure 4:
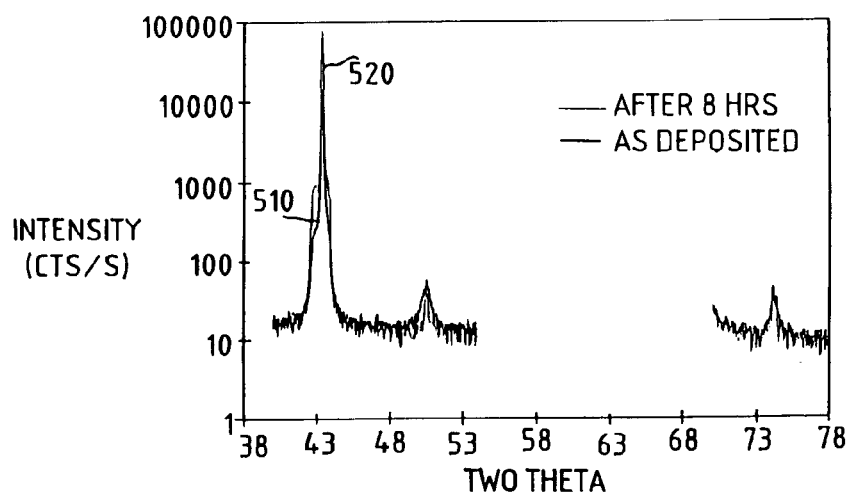
FIGS. 4 and 5 are graphs of various x-ray scanning parameters associated with an electrochemically deposited layer that has been deposited in accordance with the disclosed method.
Figure 5:
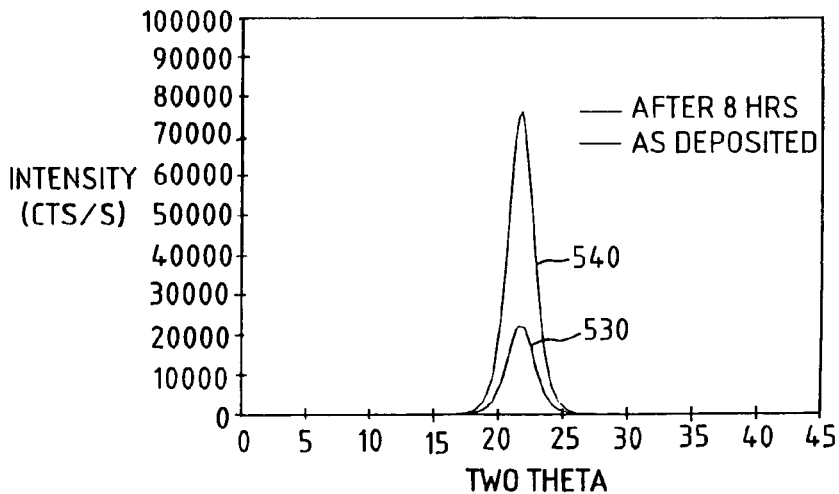

FIGS. 3–5 are derived from experimental data obtained by the present inventor on two different wafers showing that copper metallization deposited in a process in which the initial grain size of the copper crystals is sufficiently small so as to fill sub-micron dimension trenches and vias undergoes a self-annealing process at room temperature. FIG. 3 is a graph of the sheet resistance, Rs, over time of a 1.5 micron copper film deposited in the manner stated above. As illustrated, the sheet resistance begins to decrease approximately eight hours after the copper metallization has been electrochemically deposited on the wafer. After about 20 hours, a substantial decrease in the sheet resistance takes place until, ultimately, the sheet resistance is stabilized at a time between 40 and 80 hours after the deposition. Such measurements were made using a 4-point probe such as a Prometrix RS30.

FIGS. 4 and 5 relate to x-ray diffraction scanning of the electrochemically deposited copper layer. With respect to FIG. 4, the area under each curve is proportional to the volume of the copper film with crystals having their [111] crystal plane directions perpendicular to the plane of the exposed surface of the copper layer. As illustrated, line 510 represents the measurements taken immediately after the copper metallization layer was deposited onto the wafer. Line 520 represents the measurements taken hours after the metallization layer was deposited. A comparison between the curves represented by lines 510 and 520 indicates that the number of re-oriented crystals has increased over time.

In the Rocking Curves of FIG. 5, line 530 represents the Rocking Curve of the copper metallization layer immediately after it has been deposited on the wafer, while line 540 represents the Rocking Curve of the copper metallization layer hours after it has been deposited. The width of the curve designated by line 530 at half its height, when compared to that of the curve designated by line 540, indicates that the copper crystals are becoming more aligned and that the grain sizes of the copper crystals have increased.

Pursuant to the foregoing findings, one embodiment of the present method requires that the copper metallization be allowed to self-anneal for a predetermined period of time prior to chemical mechanical planarization thereof. At room temperatures, this predetermined period of time may range, for example, between 20 and 80 hours. In accordance with a further embodiment of the method, chemical mechanical planarization may take place before the self-annealing is completed (e.g., before the end of the predetermined period) and, further, may enhance the self-annealing process by imparting activation energy to the metallization layer during the process.

In accordance with a still further embodiment of the method, the copper metallization layer may be annealed before or after chemical mechanical polishing at an elevated temperature which is substantially below the temperature used in the annealing processes that have been traditionally employed. To this end, the wafer having the metallization layer may be placed in an oven having a temperature that is substantially below the 400 degrees Celsius traditionally thought to be necessary to promote the annealing process of copper having such small grain sizes. At a low temperature of about 60 degrees Celsius, the annealing process may be completed in about 15 minutes. At temperatures above 100 degrees Celsius, the annealing times become so short (<1 minute) so as to make annealing at higher temperatures unwarranted and wasteful.

The foregoing process is particularly advantageous when used prior to chemical mechanical polishing (CMP). CMP involves the use of mechanical and chemical forces to remove copper that is deposited in excess of what is desired for interconnects. As a direct result of changes in the grain size of copper films, the CMP polish rate, or removal rate, is seen to vary. The initial, small grained (i.e. many grain boundaries) films are seen to polish faster (at least with a particular CMP slurry) than they do after self-annealing and the associated grain growth. This indicates that with the particular slurry being used, the chemical action may be more severe than the mechanical action, or that the mechanical polishing is more effective on films with higher hardness values. The observed change in polish rate of 30 to 50% is to be expected as a direct result of the grain size change.

The change in grain size is expected to affect both the mechanical and the chemical aspects of CMP. Small-grained films are generally harder than large-grained ones. The hardness of a material will have a direct effect on the abrasion rate in a mechanical polishing process. Likewise, grain boundaries are chemically etched faster than single grain areas of a metal film. Therefore, a film containing a larger fraction of grain boundaries per unit surface area will chemically etch faster, on average, than one with larger grains, and therefor fewer grain boundaries.

Because of the changes in removal rate of the CMP process with a change in grain size of a copper film, the present inventors have found that it is advantageous to stabilize the copper film in a known state prior to the CMP process. If the state of the film at the time of CMP is ignored, the polish rates will vary as a function of elapsed time since deposition due to the self-annealing characteristics of the copper films observed by the present inventors. Therefore, to properly control the polish rate of the CMP process, the grain size of the deposited film when the CMP process is attempted should be in a known state. This known state may be achieved by performing the low-temperature annealing process prior to performing CMP of the workpiece, thereby effectively bypassing the self-annealing process. The low-temperature process fixes the metallization layer in the unknown state prior to performing the CMP process. As such, workpiece-to-workpiece consistency in the performance of the CMP process may be achieved.

If the CMP process is not performed prior to a low-temperature annealing of the copper film, then the CMP process should be undertaken at a predetermined time after the deposition of the film. In this manner, the CMP process is undertaken at a time at which the film characteristics are known to thereby ensure the desired workpiece-to-workpiece consistency.

Each of the disclosed embodiments of the method is particularly suitable for providing a copper metallization layer in combination with a low-K dielectric material. Many low-K dielectric materials become unstable if subject to temperatures greater than about 250–300 degrees Celsius. As such, annealing at the traditional temperatures close to about 400 degrees Celsius may destroy these dielectrics. Since the method of the present invention suggests the annealing of the copper metallization layer at temperatures substantially below 400 degrees Celsius (even ambient room temperatures typically found in clean room environments), the method is particularly suitable for use in manufacturing semiconductor devices using both copper metallization and low-K dielectric materials. With respect to the first and second embodiments of the method noted above, the wafer is not subject to any elevated temperature process to anneal the copper layer. With respect to the third embodiment discussed above, the copper metallization may be annealed at an elevated temperature that is high enough to substantially accelerate the self-annealing process while being low enough so as not to corrupt the low-K dielectric material. Low-K dielectric materials suitable for use with such copper metallization layers include, but are not limited to, fluorinated silicon dioxide, polyimides, fluorinated polyimides, siloxanes, parylenes, Teflon AF, nanofoams, aerogels, xerogels. Such low-K dielectrics include commercially available organic polymer dielectrics such as: Avatrel (B.F. Goodrich); BCB and PFCB (Dow Chemical); Flare 1.0 and Flare 1.5 (Allied Signal); PAE2 (Schumacher); and PQ100 and PQ600 (Hitachi). In such instances, the annealing process may also be combined with the baking process required for the low-K dielectric.

The process illustrated in FIGS. 2A–2G indicate that the via 420 and trench 415 are formed together. However, it will be recognized that the structures may be generally formed and filled separately in accordance with the single-damascene process described above. In such instances, the via 420 is first plated in accordance with the steps set forth in FIGS. 2A–2F while the trench 415 is subsequently plated in accordance with the steps set forth in FIGS. 2A–2F after plating of the via 420 has been completed. In effect, the via 420 corresponds to the structure 405 during plating of the trench 415. The methods disclosed herein are suitable for both the single-damascene and dual-damascene processes described herein.

It is also possible to plate micro recessed structures other than those set forth above and employ the foregoing low temperature annealing processes. For example, recessed structures forming a pattern in a photoresist layer may be plated pursuant to other processes used to form copper micro-metallization layers and structures. In such processes, the seed/barrier layer is preferably only provided at the bottoms of the microstructures and does not cover the photoresist sidewalls. After the plating of the recessed microstructures, the copper is subject to annealing at room temperature or at an elevated temperature below about 100, substantially below the 400 degrees typically employed.

Figure 6:
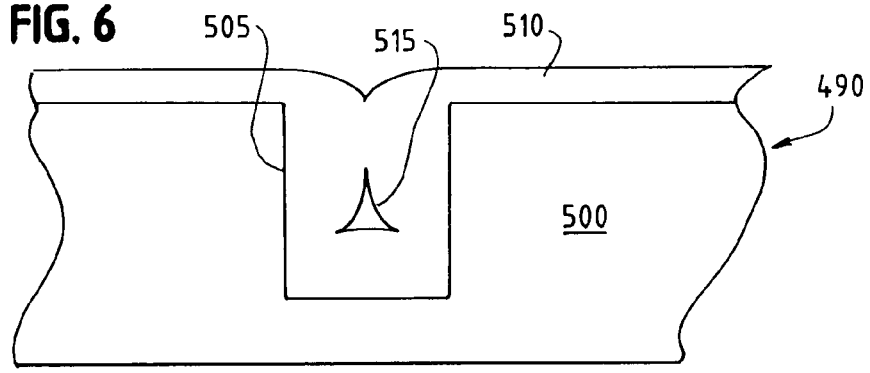
FIGS. 6–8 illustrate the use of a low-temperature annealing process to remove voids in a copper film.
Figure 7:
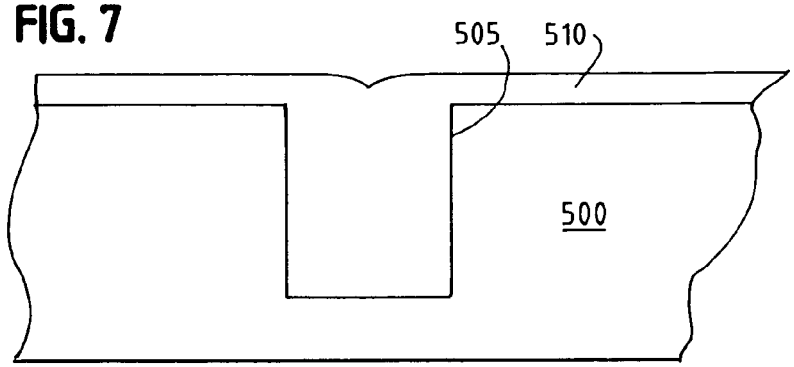

FIGS. 6 and 7 illustrate the use of low-temperature annealing of a copper film to remove voids that may occur when the copper film is deposited into, for example, a recessed microstructure of a workpiece 490. In FIG. 6, one or more material layers 500 have been patterned with one or more recessed microstructures, such as trench 505. The one or more material layers 500 may be comprised, for example, of a low-K dielectric material, a barrier layer, an adhesion layer, combinations of such layers, etc. One or more layers of copper film 510 are disposed over the upper surface of the layer 500 and in the trench 505. The copper film 510 may be comprised, for example, of a copper seed layer and a layer of copper that has been electro-deposited over the copper seed layer.

When attempting to fill a recessed microstructure, such as trench 505, the upper portion of the microstructure tends to fill before the lower portions of the microstructure have been filled. This results in a "pinch-off" condition that leaves a void region 515 within the microstructure. Such void regions 515 are undesirable and may effectively render the metallization disposed in the microstructure useless.

A low-temperature annealing of the copper film 510 may be used to close the void regions 515 that have formed within any microstructures due to the occurrence of a "pinch-off" condition. The present inventors have found that annealing temperatures of about 250 degrees Celsius and below are sufficient to eliminate such void regions 515. Annealing at temperatures of about 250 degrees Celsius and below has numerous advantages over the traditional high-temperature annealing at 400 degrees Celsius. First, such low temperature annealing processes permit the use of low-K dielectrics that would otherwise be damaged at the higher temperatures that have been traditionally used. Second, low temperature annealing reduces the concerns with respect to differential expansion of the copper film 510 and underlying materials. Third, low temperature annealing produces films having a low resistivity even when the annealing time is relatively short. Fourth, the stabilized copper film assists in ensuring uniform application of subsequent CMP processes. Finally, low temperature annealing is easily controlled and is suitable for single workpiece or batch workpiece annealing processes. FIG. 7 illustrates what the workpiece of FIG. 6 looks like after being subjected to a low temperature annealing process.

Figure 8:
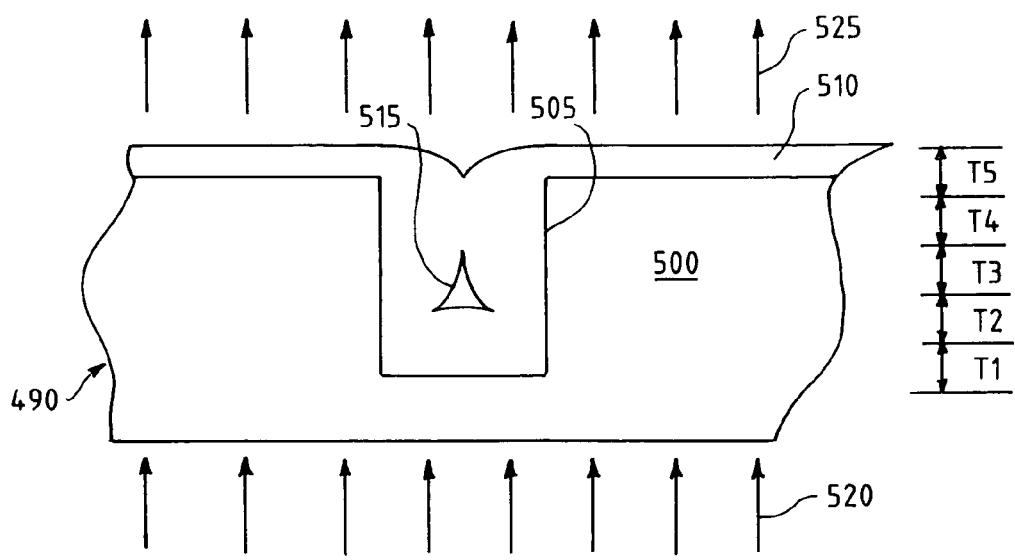

FIG. 8 illustrates a preferred manner of heating the workpiece 490 during the low-temperature annealing process. As shown, heat is applied to one side of the workpiece 490, as illustrated by arrows 520, and is removed from the workpiece 490 from the opposite side, as illustrated by arrows 525. Preferably, heat is applied to or generated at the side of the workpiece 490 proximate the lower portions of the microstructure 505, and is removed from the workpiece at the upper surface of the copper film 510. This creates a temperature gradient through the cross-section of the workpiece 490. This temperature gradient is illustrated by temperature designations T1 through T5, where: T1>T2>T3>T4>T5. The temperature gradient through the copper film 510 causes a stress gradient that provides a driving force that promotes re-crystallization of the copper film 510. This stress gradient is due to the fact that the thermal expansion of the copper film is constrained by (1) of underlying material layers and (2) the overlying film at lower temperature.

Figure 9:
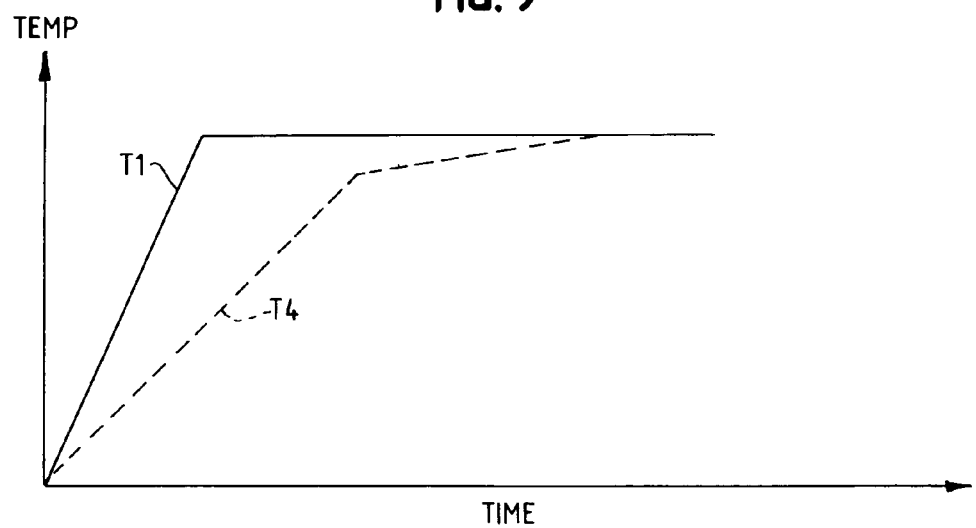
FIGS. 9 and 10 illustrate the effect of temperature rate on temperature gradient over a cross-section of the workpiece of FIGS. 6–8.
Figure 10:
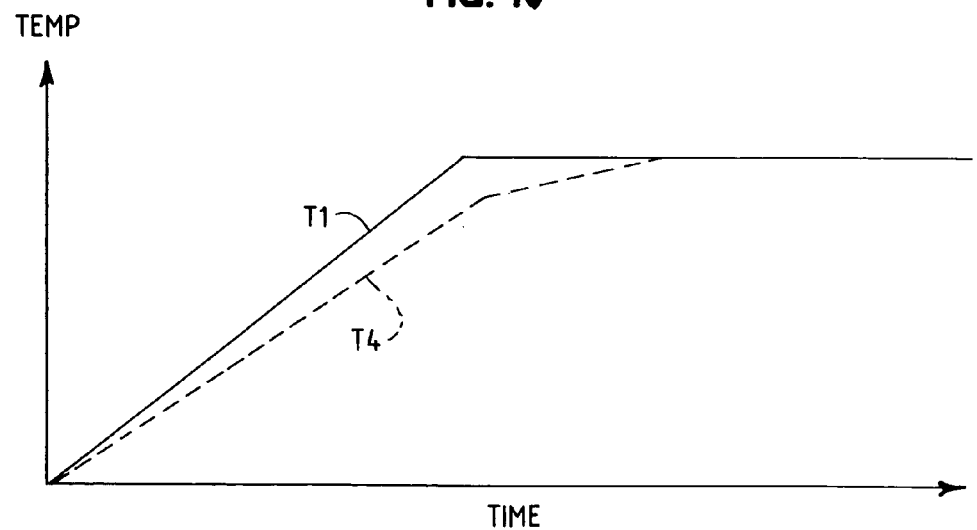

One factor that may be used to control the magnitude of temperature gradient across the workpiece is the temperature ramp rate that is used to apply the heat. Higher magnitude ramp rates will result in larger temperature gradients, particularly at the end of the ramp. This property is illustrated in FIGS. 9 and 10 in which the ramp rate of FIG. 9 is greater than the ramp rate of FIG. 10.

Figure 11:
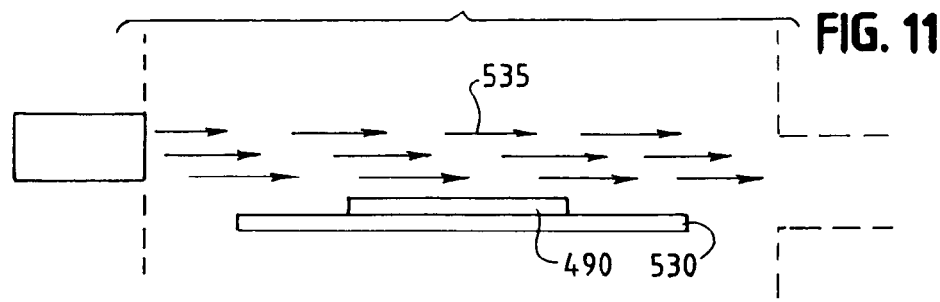
FIGS. 11–15 illustrate various apparatus that may be used in the disclosed low-temperature annealing process.

FIGS. 11–15 illustrate various manners of heating a surface of the workpiece 490 to create the desired temperature gradient. In FIG. 11, the workpiece 490 is disposed on a hot plate 530 to heat a first side of the workpiece. Heat is removed from the opposite side of the workpiece 490 by directing a flow of a cooler gas, illustrated by arrows 535 across the workpiece. The temperature difference between the hot plate 530 and the cooler gas 535, as well as the flow rate of the gas, can be used to control the temperature gradient. Depending on the desired temperature gradient, a separate source of cooler gas may be unnecessary thereby allowing the use of ambient gas.

Figure 12:
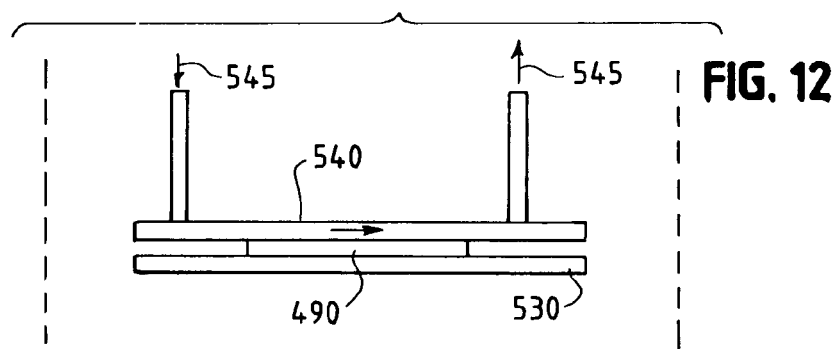

FIG. 12 illustrates a further manner of generating the desired temperature gradient. In this embodiment, the hot plate 530 is used to apply heat to the first side of the workpiece 490. However, heat is extracted from the second side of the workpiece 490 by a heat sink 540 that, for example, may be cooled by a controlled flow of coolant, as illustrated by arrows 545. The temperature gradient may be controlled, for example, by regulating the temperature and flow of the coolant.

Figure 13:
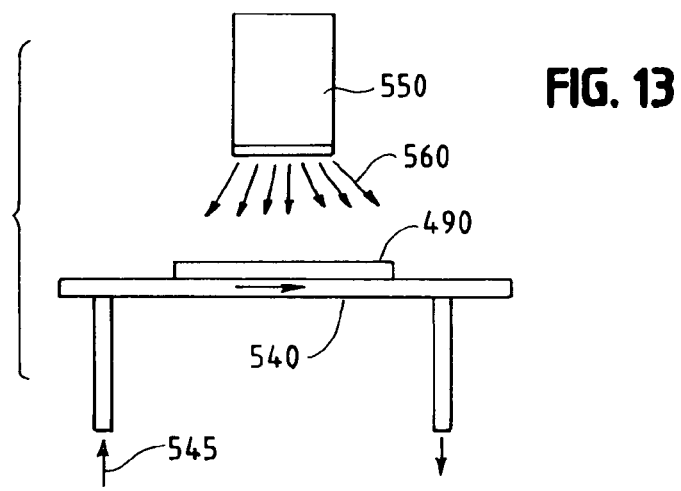
Figure 14:
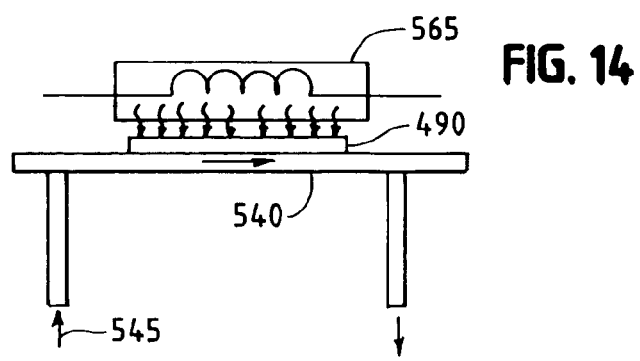

Radiant heating of the workpiece 490 using, for example, ultra-violet light is illustrated in FIG. 13. As shown, a source of ultra-violet light 550 is disposed above the workpiece 490 and radiates ultra-violent light energy, as shown at arrows 560 to generate heat at a first side of the workpiece. Heat may be removed from the second side of the workpiece 490 by any one of a variety of the apparatus. In the illustrated embodiment, heat is removed from the second side of the workpiece 490 by the heat sink 540 that is cooled by a controlled flow of coolant. A similar configuration is illustrated in FIG. 14 where the first side of the workpiece 490 is heated by a heating element 565.

Figure 15:
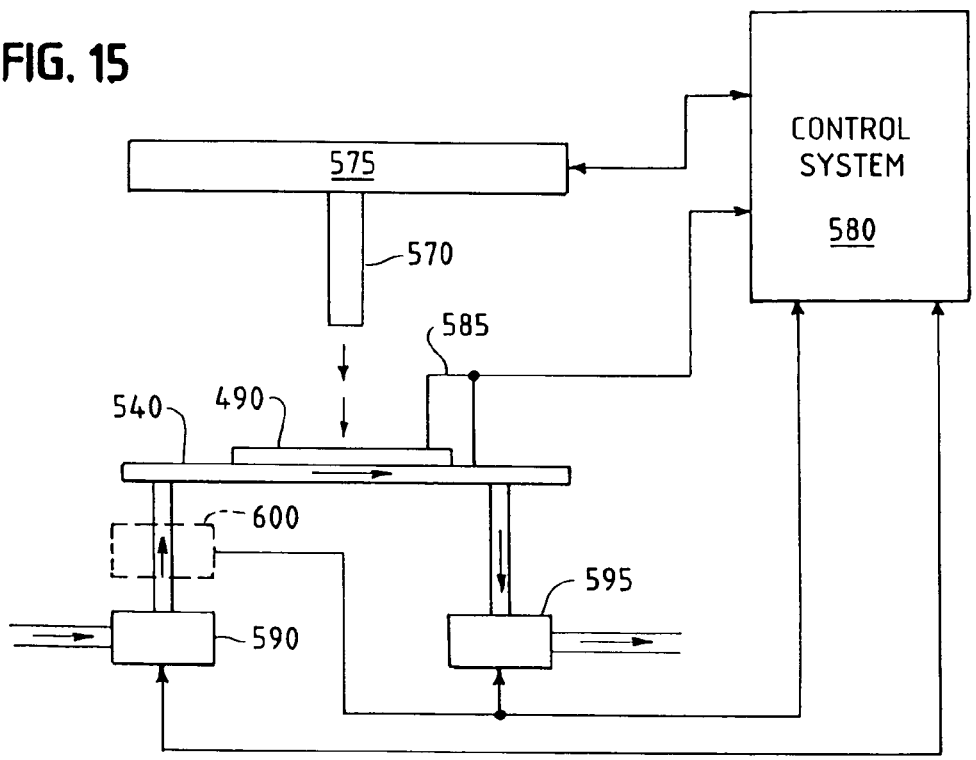

A high-precision apparatus for generating the desired temperature gradient is illustrated in FIG. 15. In this embodiment, a laser 570 is connected for two-dimensional movement to a laser position drive mechanism 575. Control of the position of the laser 570 by the drive mechanism 575 is effected by a programmable control system 580.

The laser 570 is disposed to direct laser light toward a first side of the workpiece 490 to generate heat at the first side. The laser 570 may be dynamically positioned during the annealing process to selectively heat predetermined portions of the first side for predetermined periods of time. The laser position, laser light intensity, and time duration used for annealing the predetermined portions of the first side may be, for example, set by a recipe that is entered by the user. One or more temperature sensors may be disposed at the first side of the workpiece to effect temperature feedback control of the annealing process, as illustrated at line 585.

Heat is removed at the second side of the workpiece 490 by the heat sink 540. Accurate control of the temperature of the heat sink 540 and, thus, the temperature gradient, may be effected by accurately controlling the temperature and flow rate of the coolant. In the illustrated embodiment, the flow of coolant is regulated by a flow regulator 590 that is under the control of the control system 580. Higher coolant flow rates through the heat sink 540 typically result in larger temperature gradients while lower coolant flow rates typically result in smaller temperature gradients. As such, programming within the control system 580 may actuate the flow regulator 590 to limit coolant flow when the temperature gradient, or a measured parameter related thereto, exceeds a predetermined recipe value and to increase coolant flow when the temperature gradient, or a measured parameter related thereto, falls below a predetermined recipe value. Flow regulation may also be obtained by replacing flow regulator 590 with a pump mechanism.

One or more measurable parameters may be used as a basis for controlling the coolant flow. For example, a temperature sensor 595 may be used to measure the temperature of the coolant as it exits the heat sink 540. The output of the temperatures sensor 595 may be applied as an input to the control system 580 to effect coolant flow and/or coolant temperature. Alternatively, or in addition, a temperature sensor 600 may be used to measure the temperature of the coolant as it enters the heat sink 540. In instances in which both temperature sensors 595 and 600 are utilized, the control system 580 may use the temperature difference between the entering and exiting coolant to calculate the amount of heat extracted at the second side of the workpiece 490. This calculated heat value, in turn, may be used to control the laser light intensity and coolant flow rate according to a user programmed recipe, a multi-variable system model, recipe/model combinations, etc.

Figure 16:
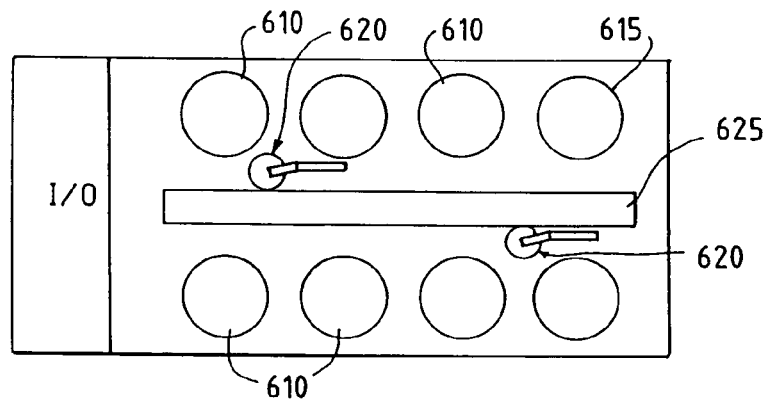
FIGS. 16 and 17 illustrate hollow the apparatus of FIGS. 11–15 may be integrated in a wet chemical processing tool set.
Figure 17:
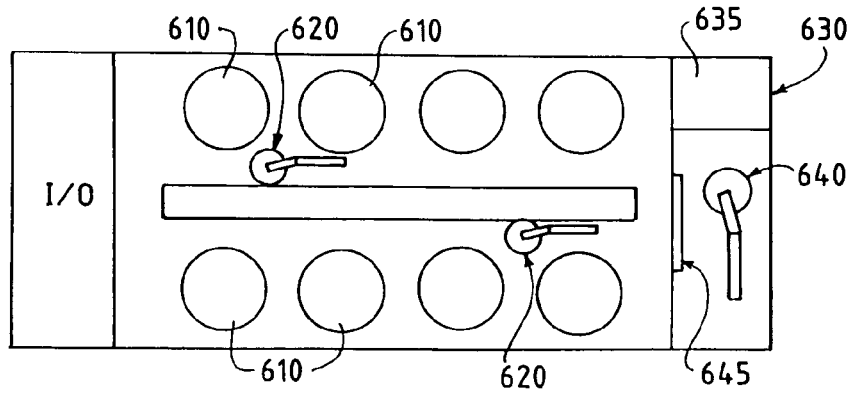

One or more of the foregoing heating systems may be integrated with a wet-chemical processing tool that is capable of electrochemical deposition of copper. Once such processing tool is the LT-210™ electroplating apparatus available from Semitool, Inc., of Kalispell, Mont. FIGS. 16 and 17 illustrate such integration.

The system of FIG. 16 includes a plurality of processing stations 610. Preferably, these processing stations include one or more rinsing/drying stations and one or more electroplating stations, although further wet-chemical processing stations may also be employed. The system also preferably includes an annealing station, such as at 615, for executing a low-temperature annealing process on each workpiece. The annealing process may be executed in a single-wafer or batch processing fashion. The workpieces are transferred between the processing stations 610 and the annealing station 615 using one or more robotic arms 620 that are disposed for linear movement along a central track 625.

FIG. 17 illustrates a further manner in which an annealing station 630 may be integrated in a wet-chemical processing tool set. Unlike the embodiment of FIG. 16, this embodiment employs a separate heating unit 635 that is serviced by a dedicated robotic mechanism 640. The dedicated robotic mechanism 640 accepts workpieces that are transferred to it by the robotic mechanisms 620. Transfer may take place through an intermediate staging door/area 645. As such, it becomes possible to hygienically separate the annealing station 630 from other portions of the tool set. Additionally, the illustrated annealing station may be implemented as a separate module that is attached to upgrade an existing tool set.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. A method for reducing voids in a metal material that has been electrolytically deposited into recessed microstructures defined in a surface of a microelectronic workpiece comprising:
    electrolytically depositing a metal to substantially fill recessed sub-micron structures in the surface of the workpiece; and then
    subjecting the workpiece to an annealing process at a temperature that is at or below about 250 degrees Celsius, the workpiece being subjected to a controlled temperature gradient in which the temperature decreases along a cross-section of the workpiece in a direction that is opposite to the direction of formation of the metal material during its deposition.

2. A method as set forth in claim 1 wherein the metal material comprises copper.

3. The method of claim 1, further comprising depositing a barrier layer on the surface of the workpiece in which the recessed microstructures are formed prior to depositing metal to substantially fill the recessed microstructures.

4. The method of claim 1, further comprising depositing a seed layer, substantially comprised of the same metal to be deposited to substantially fill the recessed microstructures, onto the surface of the workpiece prior to depositing the metal to substantially fill the recessed microstructures.

5. A method for reducing voids in a metal material that has been electrolytically deposited into recessed microstructures defined on a surface of a microelectronic workpiece comprising:
    electrolytically depositing a metal to substantially fill recessed sub-micron structures on the surface of the workpiece; and then
    subjecting the workpiece to an annealing process to generate a controlled temperature gradient in which the temperature decreases along a cross-section of the workpiece in a direction that is toward the surface in which the recessed sub-micron structures are formed.

6. The method of claim 5, further comprising depositing a seed layer, substantially comprised of the same metal to be deposited to substantially fill the recessed microstructures, onto the surface of the workpiece prior to depositing the metal to substantially fill the recessed microstructures.

7. A method of processing a microelectronic workpiece having a surface including a sub-micron recessed microstructure, comprising:
- electroplating copper at an electroplating station to substantially fill the recessed microstructure and to deposit excess copper above the recessed microstructure;
- thereafter, robotically transferring the workpiece from the electroplating station for at least one further process that includes thermal processing at a thermal processing station, the thermal processing comprising thermally treating the electroplated copper by establishing a temperature gradient through the electroplated copper having a maximum gradient temperature of about 60 degrees Celsius to about 100 degrees Celsius for no longer than 15 minutes, thereby reducing resistivity of the copper and reducing voids which may be present in the copper.

8. The method of claim 7 further comprising removing the excess copper after the thermal processing.

9. The method of claim 8 wherein the excess copper is removed via chemical mechanical polishing.

10. The method of claim 7 wherein the workpiece is thermally treated with a plurality of other workpieces in batch processing fashion.

11. The method of claim 7 wherein the workpiece is thermally treated by flowing a temperature-controlled fluid over a surface of the workpiece.

12. The method of claim 11 wherein the temperature-controlled fluid comprises a gas.

13. The method of claim 11 wherein the temperature-controlled fluid comprises a cooling fluid.

14. The method of claim 7 wherein the workpiece is thermally treated by radiant heating.

15. The method of claim 7 wherein the workpiece is thermally treated by a hot plate.

16. The method of claim 7 further comprising sensing a control temperature and controlling heating of the workpiece in response to the sensed temperature.

17. The method of claim 16 wherein the control temperature is a temperature of a coolant fluid after the fluid is brought into thermal contact with the workpiece.

18. The method of claim 7 wherein the temperature in the temperature gradient decreases in a direction outwardly from the filled recessed microstructure toward the excess copper.

19. The method of claim 7 wherein the temperature gradient induces a stress gradient in the electroplated copper.

20. A method of treating a workpiece having a base having a surface, a dielectric layer carried on the surface of the base, and recessed sub-micron structures formed in the dielectric layer, comprising:
- depositing a conductive seed layer exterior to the dielectric layer and in the recessed sub-micron structures;
- contacting the seed layer with a copper-containing electroplating solution;
- applying electroplating power to the seed layer to electrolytically deposit copper metal from the electroplating solution to substantially fill the recessed sub-micron structures and to deposit excess copper metal which extends beyond an exterior surface of the dielectric layer; then
- subjecting the electroplated workpiece to an elevated temperature annealing process comprising establishing a temperature gradient in which the temperature decreases in a direction moving outwardly from the base toward the dielectric layer, the annealing process having a maximum gradient temperature which is no greater than about 250 degrees Celsius.

21. The method of claim 20 wherein the maximum temperature of the annealing process is at or below about 100 degrees Celsius.

22. The method of claim 20 wherein the maximum temperature of the annealing process is between about 60 degrees Celsius and about 100 degrees Celsius.

23. The method of claim 20 wherein the workpiece is subjected to the annealing process for no longer than 15 minutes.

24. The method of claim 20 wherein the workpiece is subjected to the annealing process for less than one minute.

25. The method of claim 20 further comprising depositing a barrier layer on the dielectric layer and in the sub-micron structures prior to depositing the seed layer.

26. The method of claim 20 wherein the temperature gradient induces a stress gradient in the electroplated copper.

27. The method of claim 20 wherein the electroplating power is initially applied at a first current for a predetermined first period of time, then applied at a higher second current for a predetermined second period of time.

28. The method of claim 20 wherein the electroplating power is applied as a direct current.

29. The method of claim 20 wherein the electroplating power is applied as a pulsed waveform at a frequency of between 1 and 1000 Hz.

30. The method of claim 29 wherein the frequency of the pulsed waveform is between 5 and 20 Hz with a duty cycle of at least 50 percent.

31. The method of claim 20 wherein the workpiece is spun while electroplating power is applied.

32. The method of claim 20 further comprising removing the excess copper after the workpiece is subjected to the elevated temperature annealing process.

33. A method of treating a microelectronic workpiece having a base having a surface including a sub-micron recessed microstructure, comprising:
- contacting the surface of the workpiece with a copper-containing electroplating solution;
- applying electroplating power at a first power level for a first period of time, then applying electroplating power at a higher second power level for a time sufficient to substantially fill the recessed sub-micron structures with electroplated copper metal and to deposit excess copper metal above the sub-micron recessed microstructures; then
- subjecting the electroplated workpiece to an elevated temperature annealing process comprising establishing a temperature gradient through the electroplated copper metal in which the temperature decreases in a direction moving outwardly from the base toward the workpiece surface, the annealing process having a maximum gradient temperature which is no greater than about 250 degrees Celsius.

34. The method of claim 33 wherein the maximum temperature of the annealing process is at or below about 100 degrees Celsius.

35. The method of claim 33 wherein the maximum temperature of the annealing process is between about 60 degrees Celsius and about 100 degrees Celsius.

36. The method of claim 33 wherein the workpiece is subjected to the annealing process for no longer than 15 minutes.

37. The method of claim 33 wherein the workpiece is subjected to the annealing process for less than one minute.

38. The method of claim 33 further comprising depositing a barrier layer on the dielectric layer and in the sub-micron structures prior to depositing the seed layer.

39. The method of claim 33 wherein the temperature gradient induces a stress gradient in the electroplated copper.

40. The method of claim 33 wherein the seed layer is contacted with the electroplating solution for a predetermined dwell period before the electroplating power is applied.

41. The method of claim 33 wherein the electroplating power is applied as a direct current.

42. The method of claim 33 wherein the electroplating power is applied as a pulsed waveform at a frequency of between 1 and 1000 Hz.

43. The method of claim 42 wherein the frequency of the pulsed waveform is between 5 and 20 Hz with a duty cycle of at least 50 percent.

44. The method of claim 33 wherein the workpiece is spun while electroplating power is applied.

45. The method of claim 33 further comprising removing the excess copper after the workpiece is subjected to the elevated temperature annealing process.

46. A method of treating a microelectronic workpiece having a base having a surface including a sub-micron recessed microstructure, comprising:
    contacting the surface of the workpiece with a copper-containing electroplating solution;
    applying electroplating power to the workpiece in a pulsed waveform having a frequency of between about 1 and 1000 Hz to substantially fill the recessed sub-micron structures with electroplated copper metal and to deposit excess copper metal above the sub-micron recessed microstructures; then
    subjecting the electroplated workpiece to an elevated temperature annealing process comprising establishing a temperature gradient through the electroplated copper in which the temperature decreases in a direction moving outwardly from the base toward the surface of the workpiece, the temperature gradient having a maximum gradient temperature which is no greater than about 250 degrees Celsius.

47. The method of claim 46 wherein the frequency of the pulsed waveform is between 5 and 20 Hz with a duty cycle of at least 50 percent.

48. The method of claim 46 wherein the maximum temperature of the annealing process is at or below about 100 degrees Celsius.

49. The method of claim 48 wherein the maximum temperature of the annealing process is between about 60 degrees Celsius and about 100 degrees Celsius.

50. The method of claim 46 wherein the workpiece is subjected to the annealing process for no longer than 15 minutes.

51. The method of claim 46 wherein the workpiece is subjected to the annealing process for less than one minute.

52. The method of claim 46 wherein a dielectric is carried on a surface of the base, the sub-micron recessed microstructures being formed in the dielectric layer, the method further comprising depositing a conductive seed layer exterior to the dielectric layer and in the sub-micron recessed microstructues.

53. The method of claim 46 further comprising depositing a barrier layer on the dielectric layer and in the sub-micron structures prior to depositing the seed layer.

54. The method of claim 52 wherein the electroplating power is applied to the seed layer.

55. The method of claim 46 wherein the temperature gradient induces a stress gradient in the electroplated copper.

56. The method of claim 46 wherein the seed layer is contacted with the electroplating solution for a predetermined dwell period before the electroplating power is applied.

57. The method of claim 46 wherein the electroplating power is applied as a direct current.

58. The method of claim 46 wherein the electroplating power is initially applied at a first current for a predetermined first period of time, then applied at a higher second current for a predetermined second period of time.

59. The method of claim 46 wherein the workpiece is spun while electroplating power is applied.

60. The method of claim 46 further comprising removing the excess copper after the workpiece is subjected to the elevated temperature annealing process.

61. A method of processing a microelectronic workpiece having a surface including a sub-micron recessed microstructure and a conductive seed layer in the sub-micron recessed microstructure, comprising:
    electroplating copper at an electroplating station to substantially fill the recessed microstructure and to deposit excess copper which extends above the sub-micron recessed microstructure;
    robotically transferring the workpiece from the electroplating station for further processing;
    removing the excess copper as one of the further processes; and
    thereafter, robotically transferring the workpiece to a thermal processing station to thermally treat the electroplated copper by establishing a temperature gradient in the electroplated copper having a maximum temperature of about 60 degrees Celsius to about 100 degrees Celsius for no longer than 15 minutes, thereby reducing resistivity of the copper and reducing voids which may be present in the copper.

62. The method of claim 61 wherein the excess copper is removed via chemical mechanical polishing.

63. The method of claim 61 wherein the microelectronic workpiece is thermally treated with a plurality of other semiconductor workpieces in batch processing fashion.

64. The method of claim 61 wherein the microelectronic workpiece is thermally treated by flowing a temperature-controlled fluid over a surface of the workpiece.

65. The method of claim 64 wherein the temperature-controlled fluid comprises a gas.

66. The method of claim 64 wherein the temperature-controlled fluid comprises a cooling fluid.

67. The method of claim 61 wherein the semiconductor workpiece is thermally treated by radiant heating.

68. The method of claim 61 wherein the semiconductor workpiece is thermally treated by a hot plate.

69. The method of claim 61 further comprising sensing a control temperature and controlling heating of the workpiece in response to the sensed temperature.

70. The method of claim 69 wherein the control temperature is a temperature of a coolant fluid after the fluid is brought into thermal contact with the workpiece.

71. The method of claim 61 wherein the temperature in the temperature gradient decreases in a direction outwardly from the filled recessed microstructure toward the excess copper.

72. The method of claim 61 wherein the temperature gradient induces a stress gradient in the electroplated copper.

73. A method of treating a microelectronic workpiece having a base having a surface including a sub-micron recessed microstructure, comprising:
contacting the surface of the workpiece with a copper-containing electroplating solution;
applying electroplating power at a first power level for a first period of time, then applying electroplating power at a higher second power level for a time sufficient to substantially fill the recessed sub-micron structures with electroplated copper metal and to deposit excess copper metal above the sub-micron recessed microstructures; then
subjecting the electroplated workpiece to an elevated temperature annealing process for a time sufficient to reduce resistivity of the electroplated copper metal.

74. The method of claim 73 wherein a maximum temperature of the annealing process is at or below about 250 degrees Celsius.

75. The method of claim 73 wherein a maximum temperature of the annealing process is at or below about 100 degrees Celsius.

76. The method of claim 73 wherein a maximum temperature of the annealing process is between about 60 degrees Celsius and about 100 degrees Celsius.

77. The method of claim 73 wherein the workpiece is subjected to the annealing process for no longer than 15 minutes.

78. The method of claim 73 wherein the workpiece is subjected to the annealing process for less than one minute.

79. The method of claim 73 further comprising depositing a barrier layer on the dielectric layer and in the sub-micron structures prior to depositing the seed layer.

80. The method of claim 73 wherein the annealing process comprises establishing a temperature gradient through the electroplated copper metal in which the temperature decreases in a direction moving outwardly from the base toward the workpiece surface, the temperature gradient inducing a stress gradient in the electroplated copper.

81. The method of claim 73 wherein the seed layer is contacted with the electroplating solution for a predetermined dwell period before the electroplating power is applied.

82. The method of claim 73 wherein the electroplating power is applied as a direct current.

83. The method of claim 73 wherein the electroplating power is applied as a pulsed waveform at a frequency of between 1 and 1000 Hz.

84. The method of claim 73 wherein the frequency of the pulsed waveform is between 5 and 20 Hz with a duty cycle of at least 50 percent.

85. The method of claim 73 wherein the workpiece is spun while electroplating power is applied.

86. The method of claim 73 further comprising removing the excess copper after the workpiece is subjected to the elevated temperature annealing process.

87. A method of treating a microelectronic workpiece having a base having a surface including a sub-micron recessed microstructure, comprising:
contacting the surface of the workpiece with a copper-containing electroplating solution;
applying electroplating power to the workpiece in a pulsed waveform having a frequency of between about 1 and 1000 Hz to substantially fill the recessed sub-micron structures with electroplated copper metal and to deposit excess copper metal above the sub-micron recessed microstructures; then
subjecting the electroplated workpiece to an elevated temperature annealing process for a time sufficient to reduce resistivity of the electroplated copper metal.

88. The method of claim 87 wherein the frequency of the pulsed waveform is between 5 and 20 Hz with a duty cycle of at least 50 percent.

89. The method of claim 87 wherein a maximum temperature of the annealing process is at or below about 250 degrees Celsius.

90. The method of claim 87 wherein a maximum temperature of the annealing process is at or below about 100 degrees Celsius.

91. The method of claim 87 wherein a maximum temperature of the annealing process is between about 60 degrees Celsius and about 100 degrees Celsius.

92. The method of claim 87 wherein the workpiece is subjected to the annealing process for no longer than 15 minutes.

93. The method of claim 87 wherein the workpiece is subjected to the annealing process for less than one minute.

94. The method of claim 87 wherein a dielectric is carried on a surface of the base, the sub-micron recessed microstructures being formed in the dielectric layer, the method further comprising depositing a conductive seed layer exterior to the dielectric layer and in the sub-micron recessed microstructures.

95. The method of claim 94 further comprising depositing a barrier layer on the dielectric layer and in the sub-micron structures prior to depositing the seed layer.

96. The method of claim 99 wherein the electroplating power is applied to the seed layer.

97. The method of claim 87 wherein the annealing process comprises establishing a temperature gradient through the electroplated copper metal in which the temperature decreases in a direction moving outwardly from the base toward the workpiece surface, the temperature gradient inducing a stress gradient in the electroplated copper.

98. The method of claim 87 wherein the seed layer is contacted with the electroplating solution for a predetermined dwell period before the electroplating power is applied.

99. The method of claim 87 wherein the electroplating power is applied as a direct current.

100. The method of claim 87 wherein the electroplating power is initially applied at a first current for a predetermined first period of time, then applied at a higher second current for a predetermined second period of time.

101. The method of claim 87 wherein the workpiece is spun while electroplating power is applied.

102. The method of claim 87 further comprising removing the excess topper after the workpiece is subjected to the elevated temperature annealing process.

* * * * *

UNITED STATES PATENT AND TRADEMARK OFFICE
CERTIFICATE OF CORRECTION

PATENT NO. : 7,001,471 B2
APPLICATION NO. : 09/386734
DATED : February 21, 2006
INVENTOR(S) : Thomas L. Ritzdorf et al.

It is certified that error appears in the above-identified patent and that said Letters Patent is hereby corrected as shown below:

On The Title Page, Item (56)
References cited, please insert the following Information Disclosure Statements allowed by the Examiner on 12/17/01:

--Mak, C.Y., "Electroless Copper Deposition on Metals and Metal Silicides," Materials Research Society Bulletin. (August 1994).

Hogan, B.M., "Microstructural Stability of Copper Electroplate," (citation unknown but believed to be published more than one year before the date of this application).

Stoychev, D., Vitanova, I. Vieweger, U., "Influence of the Inclusions in Thick Copper Coatings or Their Physico-Mechanical Properties,"
CHECK REFERENCES Stoychev, D.S., and Aroyo, M.S., "The Influence of Pulse Frequency on the Hardness of Bright Copper Electrodeposits," *Plating & Surface Finishing*, pp. 26-28 (date unknown but believed to be published more than one year before the date of this patent application).

Stoychev, D.S., and Aroyo, m.S., On the influence of Pulse Frequency on the Hardness of Bright Copper Electrodeposits, (citation unknown but believed to be published more than one year before the date of this patent application).

Stein, B., "A Practical Guide to Understanding, Measuring and Controlling Stress in Electroformed Metals," presented at the AESF Electroforming Symposium, Las Vegas, NV (March 1996).

Sanchez, J. Jr., Besser, P.R., and Field, D.P., "Microstructure of Damascene Processed AlCu Interconnects for Integrated Circuit Applications," presented at the Fourth International Workshop on Stress Induced Phenomena in Metallizations, Tokyo, Japan (June 1997).

Sanchez, J. Jr. and Besser, P.R., "Modelling Microstructure Development in Trench-Interconnect Structures," submitted to International Interconnect Technology Conference, Sunnyvale, CA (June 1998).

Field, D.P., Sanchez, J. Jr., Besser, P.R., Dingley, D.J., "Analysis of Grain-Boundary Structure in Al-Cu Interconnects," *J. Appl., Phys.*, 82(5) (September 1, 1997).

UNITED STATES PATENT AND TRADEMARK OFFICE
CERTIFICATE OF CORRECTION

PATENT NO.         : 7,001,471 B2
APPLICATION NO.    : 09/386734
DATED              : February 21, 2006
INVENTOR(S)        : Thomas L. Ritzdorf et al.

It is certified that error appears in the above-identified patent and that said Letters Patent is hereby corrected as shown below:

On The Title Page, Item (56) (cont'd)

Gupta, D., "Comparative Cu Diffusion Studies in Advanced Metallizations of Cu and Al-Cu Based Third Films," Materials Research Society Symposium Proceedings, San Francisco, CA (April 1994).

Megaw, H.D., and Stokes, A.R., "Breadths of X-Ray Diffraction Lines and Mechanical Properties of Some Cold-Worked Metals," *J. Inst. Metals*, vol. LXXI, pp. 279-289 (1944)

Thompson, C.V., and Knowlton, B.D., "Designing Circuits and Processes to Optimize Performance and Reliability: Metallurgy Meets Tcad," *Microelectronics and Reliability*, 36, P. 1683 (1996).

Carel, R., Thompson, C.V., Frost, H.J., *Material Research Society Symposium*, Vol. 343, Materials Research Society (1994).

Floro, J.A., Carel, R. and Thompson, C.V.. "Energy Minimization During Epitaxial Grain Growth Strain vs. Interfacial Energy," *Material Research Society Symposium*, Vol. 317, Materials Research Society, (1994).

Plötner, M., Urbansky, N., Preusz, A. and Wenzel, C., "Control of Mechanical Stresses and their Temperature Dependence in PVD CU Films," presented at Adv. Metalliz. & Interconn. Syst. ULSI Applic. San Diego (1997).

Wong, Chee. C., Smith, H.I., and Thompson, C.V., "Secondary Grain Growth and Graphoepitaxy in Thin Au Films on Submicrometer-Period Gratings," *Material Research Society Symposium Proc*, Vol. 47, Materials Research Society (1985).

Thompson, C.V., and Smith, H.I., "Secondary Grain Growth in Thin Films." *Material Research Society Symposium Proc.*, Vol. 57, Materials Research Society (1987).

Wong, C.C., Smith, H.I., and Thompson, C.V., "Room Temperature Grain Growth in Thin Au Films," from *Grain Boundary Structure and Related Phenomena*, supplement to *Transactions of Japanese Institute of Metals*, 27, p. 641 (1986).

UNITED STATES PATENT AND TRADEMARK OFFICE
CERTIFICATE OF CORRECTION

| | | |
|---|---|---|
| PATENT NO. | : 7,001,471 B2 | Page 3 of 4 |
| APPLICATION NO. | : 09/386734 | |
| DATED | : February 21, 2006 | |
| INVENTOR(S) | : Thomas L. Ritzdorf et al. | |

It is certified that error appears in the above-identified patent and that said Letters Patent is hereby corrected as shown below:

On The Title Page, Item (56) (cont'd)

Thompson, C.V., "Observations of Grain Growth in Thin Films," from *Microstructural Science for Thin Film Metalizations in Electronics Applications*, eds. J. Sanchez, D.A. Smith and N. DeLanerolle, The Minerals, Metals & Materials Society (1985).

Frost, H.J., Thompson, C.V., and Walton, D.T., "Abnormal Grain Growth in Thin Films Due to Anisotrophy of Free-Surface Energies," *Materials Science Forum*, Vols. 94-96, pp. 543-550, Trans Tech Publications, Switzerland (1992).

Frost, H,J., Thompson, C.V., "Microstructural Evolution in Thin Films," presented at the Symposium on Computer Simulation of Microstructural Evolution, Toronto, Canada, October 15 (1988).

Frost, H.J., Thompson, C.V., and Walton, D.T., "Grain Growth Stagnation and Abnormal Grain Growth in Thin Films," presented at TMS-AIME Fall Meeting, Indianapolis, IN (1989).

Reed-Hall, et al, "Physical Metallurgy Principles," pp. 270, 287 and 287, $83^{rd}$ Ed. (1991).

Stoychev, D.S., and Aroyo, M.S., "On the Influence of Pulse Frequency upon the Hardness of Bright Copper Electrodeposits," (citation unknown but believed to be published more than one year before the date of this patent application).

Frost, H.J. and Thompson, C.V., "Modeling of Optical Thin Films," reprint from Proceedings of SPIE (International Society for Optical Engineering, San Diego, CA 1987, printed by the Society of Photo-Optical Instrumentation Engineers (1988).

Walton, D.T., Frost, H.J. and Thompson, C.V., "Computer Simulation of Grain Growth in Thin Film Interconnect Lines," Mat. Res. Soc. Symp. Proc., vol. 225 (1991).--

Column 3
Line 61, delete "disclosed method.";

Column 17
Line 62, "microstructues" should be --microstructures--;

UNITED STATES PATENT AND TRADEMARK OFFICE
CERTIFICATE OF CORRECTION

PATENT NO. : 7,001,471 B2
APPLICATION NO. : 09/386734
DATED : February 21, 2006
INVENTOR(S) : Thomas L. Ritzdorf et al.

It is certified that error appears in the above-identified patent and that said Letters Patent is hereby corrected as shown below:

Column 20
Line 57, "topper" should be --copper--;

Signed and Sealed this

Fourth Day of September, 2007

JON W. DUDAS
*Director of the United States Patent and Trademark Office*